(12) United States Patent
Armbrecht et al.

(10) Patent No.: US 9,279,845 B2
(45) Date of Patent: Mar. 8, 2016

(54) ANTENNA CHARACTERIZATION IN A WAVEGUIDE

(75) Inventors: Gunnar Armbrecht, Fridolfing (DE); Holger Thye, Hannover (DE); Sebastian Sczyslo, Bochum (DE); Sven Dortmund, Bochum (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 1024 days.

(21) Appl. No.: 13/390,428

(22) PCT Filed: Aug. 10, 2010

(86) PCT No.: PCT/EP2010/004882
§ 371 (c)(1),
(2), (4) Date: Feb. 14, 2012

(87) PCT Pub. No.: WO2011/018206
PCT Pub. Date: Feb. 17, 2011

(65) Prior Publication Data
US 2012/0146861 A1    Jun. 14, 2012

(30) Foreign Application Priority Data
Aug. 14, 2009   (DE) .......................... 10 2009 037 336

(51) Int. Cl.
*G01R 29/10*   (2006.01)
*G01R 31/02*   (2006.01)
(Continued)

(52) U.S. Cl.
CPC .......... *G01R 29/105* (2013.01); *G01R 29/0828* (2013.01)

(58) Field of Classification Search
CPC .............................. G01R 29/08; G01R 29/0828
See application file for complete search history.

(56) References Cited

U.S. PATENT DOCUMENTS 6,437,748 B1   8/2002  Burnside et al.

FOREIGN PATENT DOCUMENTS

| JP | 20070271317 A | 10/2007 |
|---|---|---|
| KR | 20090121836 A | 11/2009 |
| WO | 9404933 A1 | 3/1994 |

OTHER PUBLICATIONS

Hui ("Application of GTEM cells to wireless communication transceiver designs. (Technical Feature)" Microwave Journal, Sep. 1, 2003.).*

(Continued)

*Primary Examiner* — Dameon E Levi
*Assistant Examiner* — Ricardo Magallanes
(74) *Attorney, Agent, or Firm* — DeLio, Peterson & Curcio, LLC.; Robert Curcio

(57) ABSTRACT

A method for determining at least one characteristic of an antenna requiring: a) positioning an antenna in a space surrounded by a waveguide; b) feeding an electric excitation signal ($u_{tx}(t)$) into a feed connection of the waveguide; c) receiving the electric response signal ($u_{rx}(t)$) emitted by the antenna resulting from the excitation signal ($u_{tx}(t)$); d) determining at least one characteristic of the antenna from a portion of the response signal ($u_{rx}(t)$) and a corresponding portion of the excitation signal ($u_{tx}(t)$), where the portion of the response signal ($u_{rx}(t)$) is evaluated in the time domain and satisfies the following conditions: (i) only one or more waves of the electromagnetic field caused by the excitation signal ($u_{tx}(t)$) and running from the feed connection towards the antenna exist at the location of the antenna; and (ii) the electromagnetic field at the location of the antenna is a TEM field.

26 Claims, 11 Drawing Sheets

(51) Int. Cl.
*G01R 27/02* (2006.01)
*G01R 35/00* (2006.01)
*G01R 23/16* (2006.01)
*G01R 29/08* (2006.01)

(56) References Cited

OTHER PUBLICATIONS

Thye et al. ("Aspects of Using the IEC 61000-4-20 for Transient Testing with Broadband Signals". IEEE International Symposium on Electromagnetic Compatibility, 2008. Date of Conference: Aug. 18-22, 2008; p. 1-5.).*

Thye et al. ("System theoretical analysis of the GTEM cell in time domain" 2008 International Symposium on Electromagnetic Compatibility—EMC Europe, Date of Conference: Sep. 8-12, 2008, p. 1-5).*

Ji et al. ("FDTD Analysis of a Gigahertz TEM Cell for Ultra-wideband Pulse Exposure Studies of Biological Specimens" IEEE Trans. On Biomedical Engineering, vol. 53, No. 5, May 2006).*

A. Tsaliovich, "RF Absorber Qualification Criteria and Measurement Techniques"; IEEE 1990, pp. 361-366.

L. Hoeft et al.; "Response of Typical Aircraft Antennae to Fast Risetime EMP", IEEE, 1992, pp. 116-119.

C. Icheln et al.; "Application of a GTEM Cell to Small Antenna Measurements"; IEEE, 1997, pp. 546-549.

Y. Huang et al.; "Review of Broadband Antenna Measurements"; EnCAP 2006, 4 pages.

J. Lee et al.; "Time Domain Antenna Range At Kriss"; Jun. 2008, IEEE, 2 pages.

M. Kousa; "Enhancement of Rake Receivers for Ultra-Wideband Reception"; IET Commun, 2008, vol. 2, No. 3, pp. 422-431.

B. Turetken; "Design and Realization of Printed LPDA At UHF Band"; 2004, IEEE, pp. 295-297.

Thye et al., "Transient UWB Antenna Characterization in GTEM Cells", IEEE 2009, pp. 18-23.

* cited by examiner

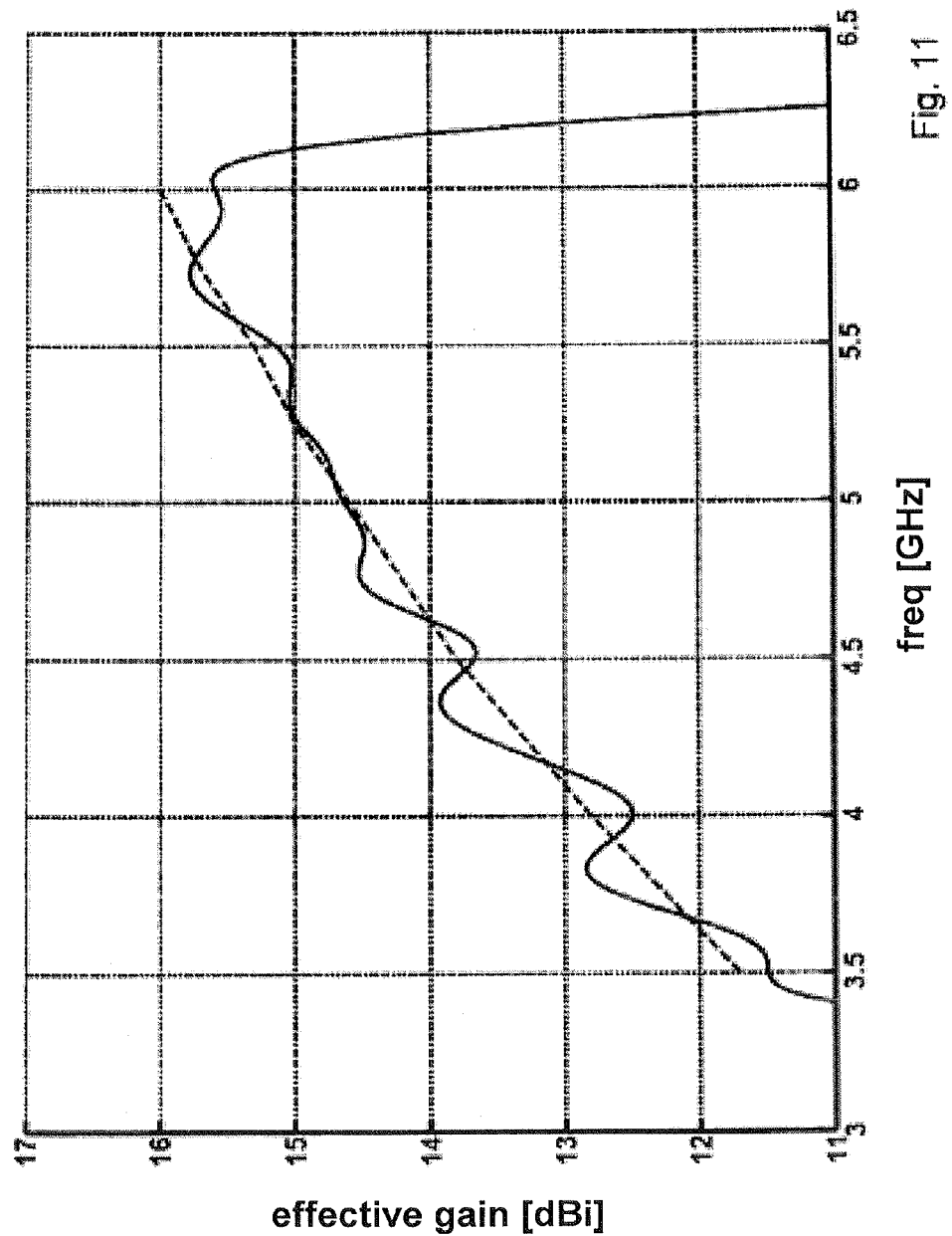

ANTENNA CHARACTERIZATION IN A WAVEGUIDE

This application is a National Stage filing based on PCT/EP2010/004882, filed Aug. 10, 2010, and which claims priority to German Patent Application No. DE 10 2009 037 336.5, filed Aug. 14, 2009.

BACKGROUND OF THE INVENTION

1. Field of the Invention

The invention relates to a method for determining at least one characteristic of an antenna and an advantageous measuring device for this purpose.

2. Description of Related Art

A characteristic of an antenna is understood to mean any kind of characteristic of the antenna, for example individual parameters, time curves of parameters or direction—and frequency-dependent characteristics, for example radiation diagrams. With known methods, such characteristic data of antennas are usually determined within the frequency domain. A test signal is thereby generated by a frequency generator, such that a so-called frequency sweep is performed over a particular frequency range which is to be examined. Each frequency is thereby held constant for a short period of time, until the antenna achieves a steady-state condition. A measurement is then carried out on the antenna in order to determine the characteristic data.

One known method is, for example, the reference antenna method, which requires an absolutely defined radiating antenna, for example an open waveguide probe or a horn antenna, as reference. A disadvantage of this method is that measuring is relatively time-consuming and/or costly, since several reference antennas often need to be provided and measured in succession, as such reference antennas display a limited, relatively narrow effective bandwidth. In order also to provide a high purity of polarization, precisely manufactured and absolutely characterized reference antennas are necessary, which are therefore relatively expensive. In many cases, therefore, such expenditure is not justified. Also known is the 2-antenna method, in which two antennas of exactly identical design must be placed opposite one another at a defined distance in a reflection-free space. This method gives rise to the problem of obtaining two antennas of exactly identical design, which can be difficult in individual cases. Also known is the 3-antenna method which, while delivering good results, is relatively time-consuming and labor-intensive.

SUMMARY OF THE INVENTION

Bearing in mind the problems and deficiencies of the prior art, it is therefore an object of the present invention to provide a more rational method for determining at least one characteristic of an antenna and a measuring device for this purpose.

This problem is solved through the invention as described in the independent claims. The dependent claims describe advantageous further developments of the invention.

The above and other objects, which will be apparent to those skilled in the art, are achieved in the present invention which is directed to a method for determining at least one characteristic of an antenna comprising the steps: positioning an antenna of which the at least one characteristic is to be determined, in a space surrounded by a waveguide; feeding an electric excitation signal ($u_{tx}(t)$) into a feed connection of the waveguide; receiving the electric response signal ($u_{rx}(t)$) emitted by the antenna as a result of the excitation signal ($u_{tx}(t)$); determining the at least one characteristic of the antenna from at least one portion of the response signal ($u_{rx}(t)$) and a corresponding portion of the excitation signal ($u_{tx}(t)$), wherein the portion of the response signal ($u_{rx}(t)$) is a time segment evaluated in the time domain which satisfies the following conditions: (i) only one or several waves of the electromagnetic field caused by the excitation signal ($u_{tx}(t)$) and running from the feed connection towards the antenna exist at the location of the antenna; and (ii) the electromagnetic field at the location of the antenna is a TEM field.

A high frequency bandwidth excitation pulse may be used as the excitation signal ($u_{tx}(t)$). The excitation signal ($u_{tx}(t)$) may be in the frequency domain. The response signal ($u_{rx}(t)$) may be recorded in the time domain. The response signal ($U_{rx}(t)$) may be recorded in phase in the frequency domain.

The frequency domain characteristics of the antenna may be determined from the response signal ($u_{rx}(t)$). The transmission properties of the antenna may be determined from the response signal ($u_{rx}(t)$). The frequency bandwidth of the excitation signal ($u_{tx}(t)$) may be equal to or greater than the frequency bandwidth the antenna.

A characteristic ($h_{rx}(t)$) proportional to the de-convolution of the response signal, ($u_{rx}(t)$), may be determined with the excitation signal ($u_{tx}(t)$).

The waveguide comprises a TEM waveguide, and in particular a TEM cell or a GTEM cell. The dimensions of the waveguide, the positioning of the antenna in the waveguide in the longitudinal direction of the waveguide, or both, may be chosen as a function of the duration of the response signal ($u_{rx}(t)$) necessary in order to determine the desired characteristic or the size of the antenna.

The antenna may include an ultra-wideband antenna. The antenna is arranged in the waveguide, movable in at least one spatial dimension or at least one axis of rotation, and a first value of a characteristic of the antenna is determined in a first antenna position and at least a second value of the characteristic in a second antenna position.

The antenna may be positioned in the waveguide such that the ratio between relatively orthogonal components of the electric field strength and the magnetic field strength of a Cartesian 2-component TEM field, wherein both components are orthogonal to the main direction of propagation of the electromagnetic field in the waveguide, is approximately the free space intrinsic impedance.

The characteristic data of the waveguide are determined through measurement and the characteristic is determined from the response signal ($u_{rx}(t)$), mathematically corrected by the characteristic data of the waveguide.

In a second aspect, the present invention is directed to a measuring device for determining at least one characteristic of an antenna, wherein the measuring device is set up to perform a method according to the present invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 11 shows a measurement result for measurement of the effective gain of a standard gain horn.

DESCRIPTION OF THE PREFERRED EMBODIMENT(S)

Figure 1:
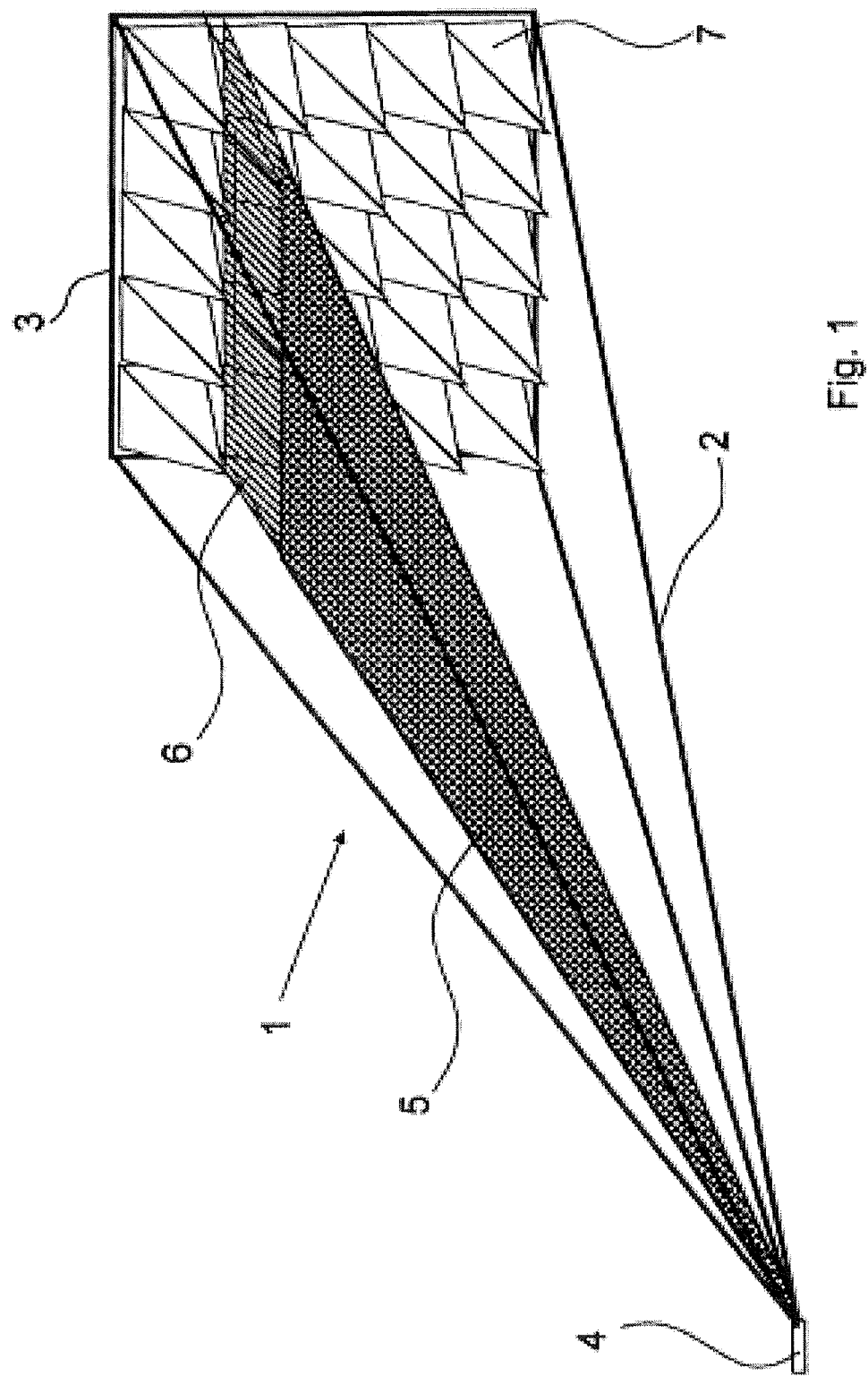
FIG. 1 shows a perspective view of the fundamental structure of a GTEM cell.

In describing the preferred embodiment of the present invention, reference will be made herein to FIGS. 1-11 of the drawings in which like numerals refer to like features of the invention.

The invention can, advantageously, be realized using simple means. It is advantageous that use can be made of widely-used measuring devices, for example a waveguide. Fundamentally, all types of waveguide which offer sufficient space for the placement of the antenna and which, at least at times, provide a TEM field at the location of the antenna can be considered as suitable for application of the invention. A TEM field is the term used to describe a transverse electromagnetic field in which the field vector of the electric field and the field vector of the magnetic field are perpendicular to one another and both field vectors are perpendicular to the direction of propagation.

Accordingly, various arrangements can be considered as waveguides which can be used advantageously in performing the invented method, for example a parallel plate line, consisting of an upper and a lower metal plate which enclose a particular space within which the antenna which is to be measured can be placed. In order to perform the invented method, the space enclosed by the waveguide need not necessarily be an enclosed space; a space which is partially open at the sides is also conceivable, in which case less shielding against external interference is provided than with an enclosed waveguide, for example a coaxial waveguide of constant width or one which widens in a longitudinal direction.

A TEM waveguide in particular is advantageous for application of the invention, since this favors a propagation of the TEM field at the location of the antenna which is advantageous for the invented method. In particular, the use of a TEM cell is advantageous, i.e. a cell which, for example, is widely used in the field of electromagnetic compatibility (EMC) measurements. A Crawford cell, for example, can be used as TEM cell. Due to its expanded useful frequency range, a Gigahertz Transverse Electromagnetic Mode (GTEM) cell can also be used particularly advantageously. This is a closed and metallically shielded measuring device in the form of a widening coaxial waveguide. GTEM cells are also widely used in various construction sizes, for example for EMC measurements, and are therefore readily available for an application of the invention.

With the present invention, the scope of applications for TEM cells, in particular GTEM cells, is expanded to include the possibility of the characterization of antennas. The invention suggests a completely different approach in comparison with the known means described in the prior art. According to the invention, an electric excitation signal is fed into a feed connection of the waveguide. An electric response signal emitted by the antenna as a result of the excitation signal is recorded, for example with an oscilloscope or a signal analyzer, such as, for example, a spectrum or network analyzer (NWA). The excitation signal can fundamentally be of any kind, for example an individual excitation pulse, a plurality of excitation pulses, or a sequence of frequencies, as in the frequency sweep mentioned above. According to the invention, at least a portion of the response signal and a corresponding portion of the excitation signal is used for the determination of the at least one characteristic of the antenna. A particular portion of the response signal is used for this purpose, namely a time segment evaluated in the time domain which fulfils the following conditions:

(i) only one or several waves of the electromagnetic field caused by the excitation signal and running from the feed connection towards the antenna exist at the location of the antenna (also referred to in the following as propagating waves); and (ii) the electromagnetic field at the location of the antenna is a TEM field.

The TEM field can propagate along flat and/or spherically curved phase fronts.

It is thus suggested that a time segment evaluated in the time domain be used in which the aforementioned conditions (i) and (ii) are fulfilled, which can, for example, be realized through the use of a suitable waveguide, for example a GTEM cell, and, for example, through the experimental determination of a suitable time segment of the response signal.

Through the aforementioned condition (i) it is ensured that the analyzed portion of the response signal does not contain any distorting superimpositions caused through reflected waves, for example through reflections from the rear wall of the GTEM cell. Instead, a time segment is used in which only propagating waves of the electromagnetic field exist at the location of the antenna. This allows a high accuracy of measurement and reproducibility of the antenna characterization to be achieved.

Moreover, according to the condition (ii) a time segment is used in which the electromagnetic field at the location of the antenna is a TEM field. Measuring distortions which occur through intermittent deviations of the field from the TEM characteristic can be eliminated from the measurement result, and thus a distortion of the measuring result avoided, through the definition of the time segment. The fact that the field has a TEM characteristic has the advantage that the measurement creates equivalent field conditions which correspond to those of conventional reference antenna measurements, in which the antenna which is to be examined is usually located in the far field of a reference antenna. At the location of the antenna which is to be examined, this reference antenna far field is a slightly spherically curved TEM field and therefore largely identical to the virtually flat conditions of a free space measurement. The phase fronts of the TEM field within a GTEM cell are also slightly spherically curved due to the angle of rise of the septum.

Due to its special characteristics, the use of a GTEM cell has the advantage that the analysis of the measuring results is simplified. A GTEM cell has a Dirac function as the first component of the pulse response (see IEEE publication "Pulse Propagation in Gigahertz Transverse Electromagnetic Cells," Thye, Armbrecht, Koch). The GTEM cell therefore does not distort the response signal of the antenna through its own characteristics. In particular, the influence of a convolution of the GTEM characteristics with the response signal need not be taken into account. The transformation of the response signal into the signal at the location of the antenna thus takes place without distortion (without dispersion).

The use of GTEM cells for antenna measurements has already been considered and investigated in the past. However, no sufficiently exact correlation could be established between the measuring results obtained with a GTEM cell and the measuring results obtained in free space. The reason for this was, on the one hand, that the examined antenna was used as a transmission antenna, which led to an excitation, and thus to parasitic resonances due to higher field modes in the GTEM cell, which was transformed in an undefined manner into a voltage at the coaxial connection of the GTEM cell. On the other hand, where used for reception, again due to these multimode resonance phenomena, the occurrence of which is encouraged through non-ideal absorption properties of the cell connection located on the rear wall of the GTEM cell, it was also not possible to provide a field strength at the location of the antenna which is to be examined which remains constant over the greater part of the examined frequency range. It was therefore only possible, at best, to obtain rough estimates of simple parameters.

By means of this invention, a GTEM cell can now be used for more precise antenna characterizations.

Fundamentally, the electric excitation signal, like the response signal, is a time-dependent signal.

According to an advantageous further development of the invention, a frequency domain signal can be used as excitation signal. A frequency domain signal is a signal in which a test signal is generated by a frequency generator such that a so-called frequency sweep is performed over a particular frequency range which is to be examined, i.e., discrete frequencies are set in succession, whereby each frequency is held constant for a brief period of time until the antenna achieves a steady-state condition.

Advantageously, a brief pause is provided between the setting of two frequency values of the excitation signal, the length of which is so dimensioned that the electromagnetic waves within the waveguide can decay so far that they have no relevance for the further measurement. The next frequency is then set.

Where the frequency domain signal is used as excitation signal, the full voltage response of the antenna during application of the excitation signal is recorded as the response signal. The response signal which is now obtained, which contains the plurality of fed-in frequencies, is transformed from the frequency domain into the time domain, for example through an inverse Fourier transformation. Of the response information which now exists in the time domain, a time segment is now used for the further determination of the characteristic in which only propagating waves of the electromagnetic field are present and these waves exist as a TEM field at the location of the antenna. For example, a section of the response information at the beginning of the timeline in the time domain is used for this purpose, whereby the duration is to be determined experimentally such that the aforementioned conditions are fulfilled. For example, the anticipated timing of reflected waves can be estimated on the basis of the distance of the antenna from a reflective rear wall of the waveguide and the speed of propagation of the electromagnetic field and, accordingly, the analyzed time segment cut out of the response information in such a way that it precedes the arrival of reflected waves.

According to an advantageous further development of the invention it is suggested that an electric excitation pulse, in particular an excitation pulse with high frequency bandwidth, is fed as excitation signal, and that the response signal of the antenna be recorded as a time curve. This allows a characteristic of an antenna to be determined directly in the time domain, i.e., the information required for an analysis of the response signal is already present in the time domain, so that no transformation in the time domain is necessary. This means that the invented method is particularly simple to perform.

The use of an excitation pulse with high frequency bandwidth has the advantage that with a single pulse—or possibly several pulses—the antenna can be examined over a wide frequency range, for example over the entire desired reception range of an antenna. Through the use of an excitation pulse, a plurality of frequencies is transmitted to the antenna simultaneously, i.e., the frequencies which are contained in the spectrum of the excitation pulse. Through the invented method, the characterization of a single antenna is significantly faster than known methods of antenna characterization which require a plurality of reference antennas. Advantageously, through the multiple transmission of pulses of the same pulse form an increase in the achievable measuring dynamics can be achieved, for example through the elimination of noise influences through an averaging across these results of such multiple measurements.

According to an advantageous further development of the invention, a Gaussian pulse is fed in as excitation pulse. A Gaussian pulse is a pulse form in which the amplitude curve over time corresponds to, or at least resembles, a Gaussian normal distribution curve. Such a Gaussian pulse has the advantage of making possible an excitation with high frequency bandwidth.

According to an advantageous further development of the invention, the leading edge of the excitation pulse is relatively steep. At the leading edge of the excitation pulse, 80% of the amplitude of the excitation pulse is passed through in less than 1 ns (nanoseconds). The steepness of the leading edge allows a high frequency bandwidth of the excitation pulse to be achieved. In this way, even an ultra-wideband antenna (UWB antenna) with at least 500 MHz bandwidth over its entire frequency domain can be measured with a single excitation pulse. This means that the invented method is particularly time-saving.

In effect, the invented method allows rapid, reliable antenna measurements which can be carried out economically using waveguides which are already in use, in particular in industrial applications, for example GTEM cells. A storage oscilloscope, for example, can be used to record the measurement data. Also, only a single example of an antenna with unknown characteristic data which is to be examined is necessary, i.e., additional precisely calibrated reference antennas are no longer required. In the case of more complex prototypes of antennas, in particular, this avoids the cost-intensive installation of several examples.

A further advantage of the invented method involves an inherent increase in the accuracy of measurement resulting from the analysis of a portion of the response signal as a time segment analyzed in the time domain. As studies of the propagation of waves within a GTEM cell have shown, despite the presence of a high-frequency absorber a not so insignificant reflection from the rear wall of the cell occurs which leads to a reflected wave (see IEEE publication "Pulse Propagation in Gigahertz Transverse Electromagnetic Cells," Thye, Armbrecht, Koch). In the case of measurements in the frequency domain in which each individual measuring frequency has to be kept constant for at least a short period of time, a superimposition between propagating and reflected waves necessarily takes place at the antenna which distorts the measurement result. Through the analysis in the time domain suggested with the present invention, measuring data can be recorded on the antenna before the reflected wave reaches the antenna. In this way, undesired interfering influences through reflections can be avoided, even if a frequency domain signal is used as excitation signal.

According to an advantageous further development of the invention, the response signal is recorded in the time domain. The recording can, for example, be carried out using a storage oscilloscope. Recording directly in the time domain has the advantage of simplifying analysis of the signal and the determination of the characteristic of the antenna. For example, the response signal can directly represent the characteristic of the antenna. In this case the response signal is a two-dimensional curve, for example a voltage over time, from which the skilled person in the field of antennas can derive the characteristics of the antenna which is to be examined. A further advantage is that the suggested measurements in the time domain make it possible to use electro-optical converters to transmit the response signal from the antenna to the measuring device, since only amplitude values, in the form of a time curve, need to be transmitted as the response signal from the antenna, and no reference to the phase position is necessary. In turn, the possibility of using electro-optical converters in combination with optical fibers has the advantage that parasitic field distortions in the vicinity of the antenna are reduced in comparison with conventional metallic cables.

According to an advantageous further development of the invention, a frequency domain signal is used as excitation signal. This has the advantage that existing vectorial network analyzers previously used for antenna measurement can continue to be used.

According to an advantageous further development of the invention, a network analyzer is used to perform the invented method, i.e., in order to generate the excitation signal and for the recording and analysis of the response signal. The network analyzer can, for example, be set up specifically to perform the invented method through expansion in terms of software.

According to an advantageous further development of the invention, the response signal is recorded in phase within the frequency domain. In this way, advantageously, the amplitude and phase position of the complex response variable can be recorded directly in the base of the antenna (vectorial measurement). The response signal recorded in the frequency domain can then be transformed into the time domain via an inverse Fourier transformation and further analyzed in sections.

According to an advantageous further development of the invention, the response signal can be further analyzed in order to determine the characteristic. For example, frequency domain characteristics of the antenna can be determined from the response signal. For this purpose, the time segment of the antenna response analyzed in the time domain can be transformed into the frequency domain. Characteristics such as the gain, directional characteristic and/or efficiency of the antenna, for example, can be determined in this way. In comparison with known antenna characterization methods in the frequency domain, according to the invention these characteristics can already be determined over an extremely wide band, i.e., for a very wide frequency range, with one measurement, in particular if the antenna was already simultaneously excited with high frequency bandwidth as a result of the electric excitation pulse.

According to an advantageous further development of the invention, transmission properties of the antenna are determined from the response signal from the antenna. The response signal in itself characterizes the reception properties of the antenna, since this involves the reception of a wave triggered by the excitation pulse. However, applying the Lorentz reciprocity theorem, the transmission signal, in particular the transmission pulse response $h_{tx}(t, \phi_i, \theta_i)$, can also be derived from the response signal from the antenna, in particular the reception pulse response $h_{rx}(t, \phi_i, \theta_i)$. This obviates the necessity for complex additional measurements to determine the transmission behavior of an antenna. The transmission pulse response can be determined from the reception pulse response as follows:

$$\vec{h}_{tx}(t, \varphi_i, \theta_i) = \frac{1}{2\pi c_0} \frac{d}{dt} \vec{h}_{rx}(t, \varphi_i, \theta_i) \quad (1)$$

where $\phi_i$ and $\theta_i$ are the respective coordinates for the orientation of the antenna in relation to the field in a spherical coordinate system, and $\phi_i$ is the azimuthal coordinate, $\theta_i$ the elevation coordinate, and $c_0$ is the speed of light.

Frequency range characteristics can also be derived from the reception-side pulse response. For this purpose it is necessary to transform the time domain signal $h_{rx}(t)$ into the frequency domain signal $H_{rx}(\omega)$ by means of Fourier transformation, where $\omega$ refers to the angular frequency. The following relationship exists with the effective gain (also known as "absolute gain") of an antenna:

$$G(\omega) = 4\pi \left(\frac{\omega}{(2\pi c_0)}\right)^2 |H_{rx}(\omega)|^2 \quad (2)$$
$$= 4\pi |H_{tx}(\omega)|^2.$$

A further typical characteristic in antenna technology is the effective antenna area. This is directly linked to the effective gain of an antenna:

$$A_{eff}(\omega) = \frac{1}{4\pi} \left(\frac{2\pi c_0}{\omega}\right)^2 G(\omega) \quad (3)$$
$$= \left(\frac{\omega}{2\pi c_0}\right)^2 |H_{tx}(\omega)|^2$$
$$= |H_{rx}(\omega)|^2.$$

The above equations illustrate the relationship between the typical time domain (reception- and transmission-side pulse response) and frequency domain characteristics (effective gain and antenna area). These make it clear that the reception-side pulse response is directly linked to the effective antenna area, whereas the transmission-side pulse response is directly linked to the effective gain. The relationship between effective antenna area and effective gain is established via the frequency.

"Reception-side" (index "rx") means that the antenna is used to receive signals; "transmission-side" (index "tx") means that the antenna is used to transmit signals.

Starting out from the aforementioned characteristics, further characteristics such as directivity, efficiency, IEEE gain and group delay can be derived.

According to an advantageous further development of the invention, the frequency bandwidth of the excitation signal is equal to or greater than the frequency bandwidth of the antenna which is to be measured. Advantageously, this makes it possible to measure the antenna which is to be examined over its entire frequency spectrum with a single excitation signal, in particular with a single excitation pulse.

According to an advantageous further development of the invention, the antenna which is to be examined is an ultra-wideband antenna, in particular an antenna with at least 500 MHz frequency bandwidth. It has been found that the invented method is particularly advantageous for the measurement of very broadband antennas.

According to an advantageous further development of the invention, the antenna is arranged in the waveguide so as to be movable in at least one spatial dimension or at least one axis of rotation. For example, the antenna can, by means of a corresponding electric drive, be rotatable around all three spatial coordinate axes. According to the further development, a first value of a characteristic of the antenna is determined in a first antenna position and at least a second value of the characteristic in a second antenna position. This allows a series of characteristics to be determined rapidly and simply in a plurality of antenna positions. In effect, this allows two- and/or three-dimensional radiation characteristics of the antenna to be determined quickly. In particular, if a GTEM cell is used, with a purely 2-component TEM field, an independent, i.e., coupling-free, characterization of the co- and cross-polar antenna components is possible through rotation of the antenna by 90° in relation to the direction of propagation.

According to an advantageous further development of the invention, the dimensions of the waveguide and/or the positioning of the antenna in the waveguide in the longitudinal direction of the waveguide are chosen depending on the duration of the response signal necessary for a determination of the desired characteristic and/or the size of the antenna. For example, in the case of a GTEM cell, where a relatively long duration of the response signal is anticipated, the antenna is positioned somewhat further away from its rear wall than if short response signals are expected in order, in this way, to rule out the influence of reflected waves. If positioning at a greater distance from the rear wall of the GTEM cell does not appear possible, for example because the distance from the side walls of the GTEM cell is too small for an undistorted measurement, a larger GTEM cell should be chosen accordingly.

According to an advantageous further development of the invention, the antenna is arranged in a position in the waveguide in which the ratio between relatively orthogonal components of the electric field strength and the magnetic field strength of a Cartesian 2-component TEM field—wherein both components are orthogonal to the main direction of propagation of the electromagnetic field in the waveguide—comes as close as possible to the free space intrinsic impedance. This prevents distortions of the measuring signal through undesired cross-polarization coupling.

According to an advantageous further development of the invention, the method according to the claims is given the added step that characteristic data of the waveguide are determined through measurement. The determination of this data can, for example, take place through positioning of a field sensor with known, defined characteristic data in the waveguide and through feeding of an excitation pulse, as described for the GTEM cell in the IEEE publication "Pulse Propagation in Gigahertz Transverse Electromagnetic Cells," Thye, Armbrecht, Koch. In contrast to the placement of an antenna with unknown properties which is to be measured, a measurement of the unknown properties of the specific GTEM cell or of the waveguide by means of a field sensor serving as reference thus takes place in this step. Finally, the characteristic of the antenna is determined from the response signal of the antenna, which is determined in accordance with the claims, in combination with the measured characteristic data of the waveguide, in that the response signal is corrected mathematically by the characteristic data of the waveguide. This further increases the accuracy of measurement of the invented method. Undesired distortions through the waveguide can be eliminated mathematically.

The invention also relates to a measuring device for determining at least one characteristic of an antenna, wherein the measuring device is set up to perform a method of the kind described above. For this purpose, the measuring device can, for example, contain a signal generating device for generating the excitation signal and a signal recording device for recording the response signal as well as an integrated analysis of the response signal. The invention also comprises a separate expansion device which is adapted accordingly in order to determine at least one characteristic of an antenna according to a method of the kind explained above.

The adaptation of the measuring device or of the expansion device can, for example, be effected through a modification or expansion of the software for the device in question. An advantageous embodiment of the invention relates to a network analyzer specially adapted in order to perform a method of the kind described above.

A GTEM cell is described in the following as an example of a waveguide. As can be seen in FIG. 1, a GTEM cell 1 has a pyramid-like form. The GTEM cell 1 possesses a metallic outer housing 2 with rectangular cross section. The outer housing 2 is terminated on the side facing away from the point of the pyramid by a rear wall 3. A high frequency absorber 7 is provided in the vicinity of the rear wall 3 which possesses a plurality of absorber elements in pyramidal form. A flat inner conductor 5 in plate form is arranged decentrally in the interior of the GTEM cell 1. The inner conductor 5 is also referred to as a septum. An impedance region 6 is provided in the region of the septum 5 adjacent to the rear wall 3. Through the combination of the impedance region 6 with the high frequency absorber 7, the GTEM cell 1 is terminated essentially free of reflection with the desired characteristic impedance.

The septum 5 is arranged within the GTEM cell 1 in such a way that a characteristic impedance of 50Ω is achieved which is constant over the length of the GTEM cell 1. The GTEM cell 1 possesses an electric coaxial connection 4 for a coaxial feed line for feeding in signals. The inner conductor of the coaxial connection 4 passes continuously from the connection point into the septum 5 of the GTEM cell 1. The outer conductor of the coaxial connection 4 passes continuously from the connection point into the outer conductor of the GTEM cell 1, i.e., into the metallic outer housing 2.

Figure 2:
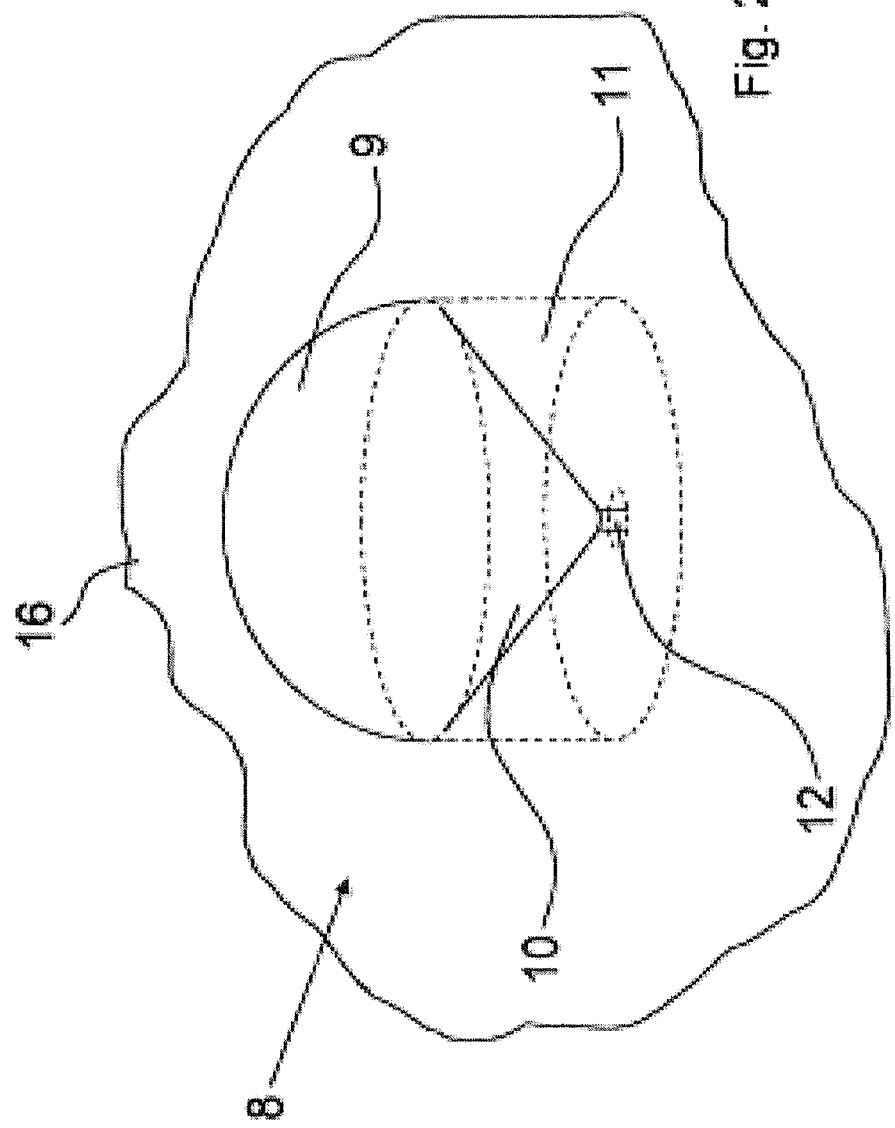
FIG. 2 shows a perspective view of an example of an antenna which is to be examined.

FIG. 2 shows an example of an ultra-wideband antenna in the form of a conical antenna 8. The conical antenna 8 possesses a metallic antenna body 9, 10 which has an upper roughly hemispherical region 9 and a lower roughly conical region 10. The antenna body 9, 10 is held by a base 11 (drawn in broken lines), which consists, for example, of Poly(methyl methacrylate) (PMMA), such as Lucite® or Perspex®. The conical region 10 of the antenna 8 ends in an antenna connection 12, which is passed out of the base 11. The antenna body 9, together with a metallic base plate 16, forms a monopole antenna structure.

Figure 3:
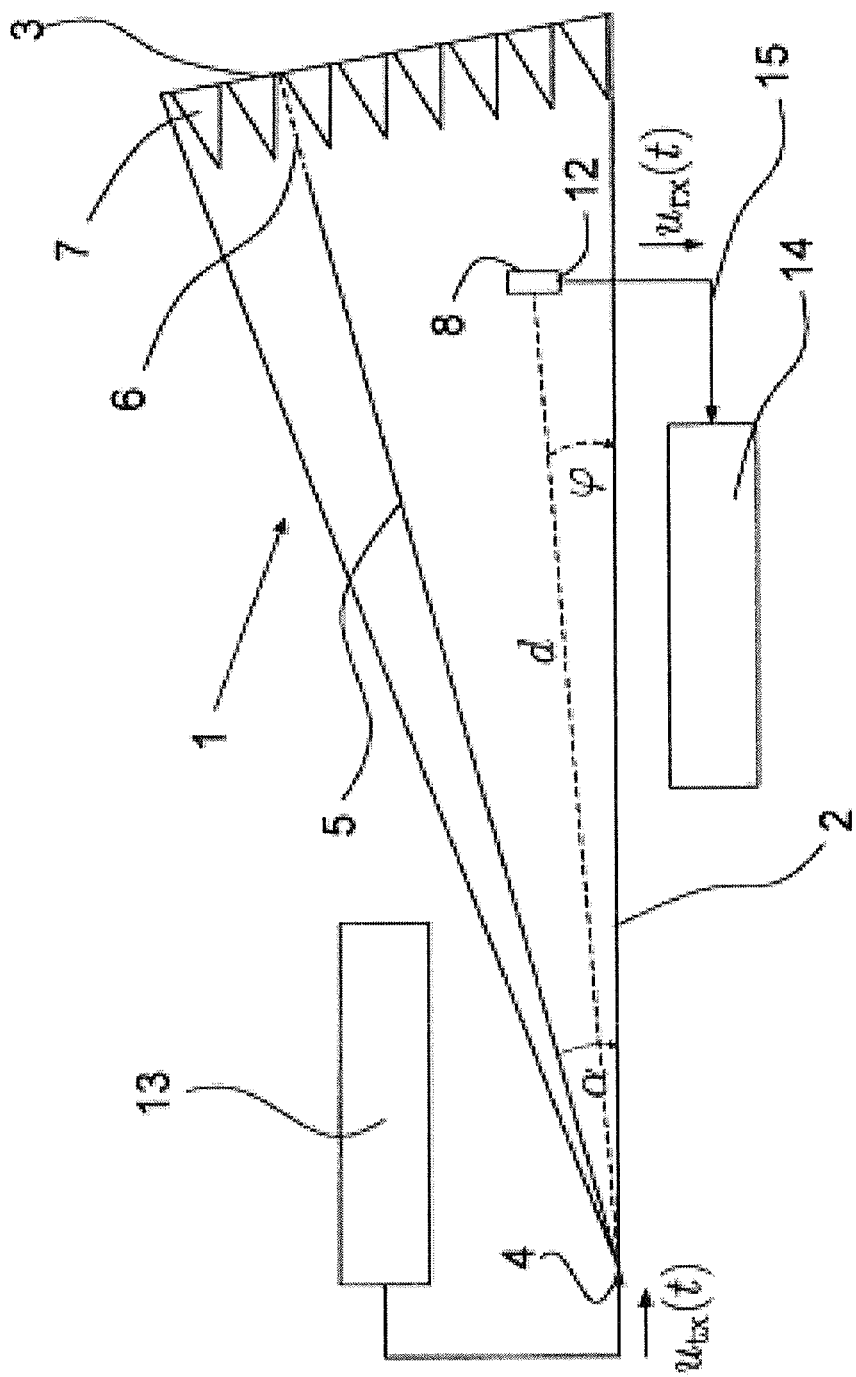
FIG. 3 shows a side view of a measuring arrangement for performing the invented method with a GTEM cell.

FIG. 3 shows a measuring arrangement for performing the invented method. The GTEM cell 1 is shown from the side in FIG. 3. A pulse generator 13 is connected to the coaxial connection 4. An antenna 8 which is to be examined is arranged within the GTEM cell 1. The antenna 8 is connected with a signal detection device 14 via a cable 15. The signal detection device 14 can for, example, be designed as a storage oscilloscope or transient recorder. Advantageously, the cable 15 can be in the form of an optical cable, i.e. an optical waveguide. In this case an electro-optical converter, which converts the signals received from the antenna 8 directly into optical signals, is connected directly to the antenna connection 12. The optical signals are then in turn converted into electric signals by an opto-electrical converter in the vicinity of the signal detection device 14.

In order to perform the invented method, an excitation pulse $U_{tx}(t)$ is fed from the pulse generator 13 into the GTEM cell 1. The electromagnetic wave which is formed and which propagates in the direction of the antenna 8 reaches the antenna 8 at a point in time and generates a response signal $U_{rx}(t)$, which is recorded by the signal detection device 14.

Figure 4:
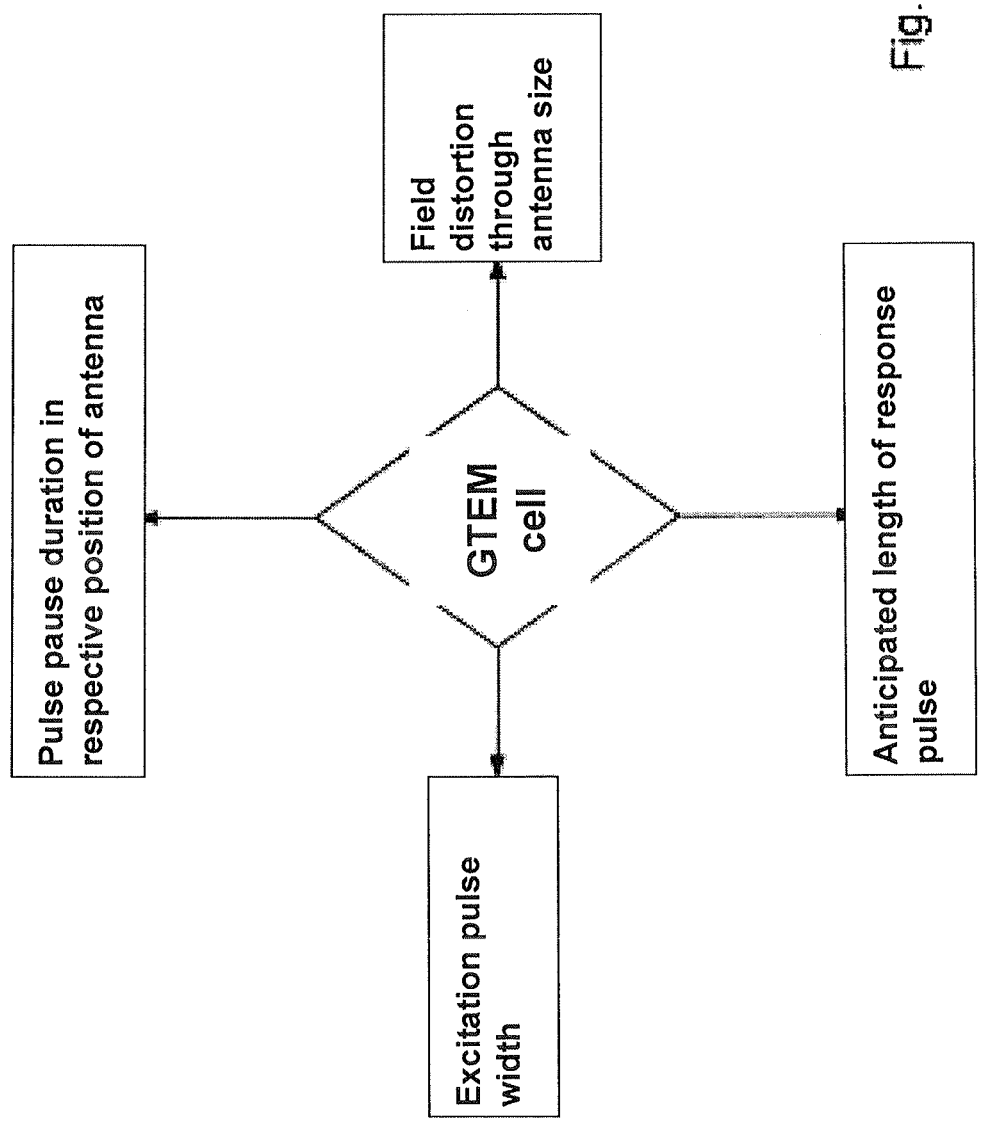
FIG. 4 shows a diagrammatic representation of the influencing factors of the invented method.

FIG. 4 shows the conflicting influencing factors which need to be taken into consideration in determining a characteristic of an antenna. The first influencing factor is the pulse pause duration at the respective position of the antenna within the GTEM cell. The pulse pause duration is the time which elapses between the full reception of the propagating wave sent to the antenna triggered by the excitation pulse and the beginning of the reception of a reflected wave. In this time interval of the pulse pause duration, it can be assumed that no distortion of the measuring result takes place through reflections off the rear wall of the GTEM cell.

The second influencing factor is the anticipated length of the response pulse from the antenna. The anticipated length must be consistent with the pulse pause duration, so that no interference is superimposed on the propagating wave of this response signal through reflected waves, for example towards the end of the response signal.

The third influencing factor is the excitation pulse width, i.e., the duration of the excitation signal. This should be significantly shorter than the pulse pause duration, which is, for example, possible through use of an ultra-wideband pulse of the kind described below.

A fourth influencing factor which needs to be taken into consideration is the size of the antenna, which should bear a sensible relationship to the cross section of the GTEM cell, so that field distortions caused through the size of the antenna become negligible. As a rule of thumb, for the example of the conical antenna, the cross sectional area of the GTEM cell in the vicinity of the position of the antenna which is to be examined should be at least 25 times as great, or approximately 5% of the cross sectional area, as the cross section of the antenna in the same cross sectional plane.

Figure 5:
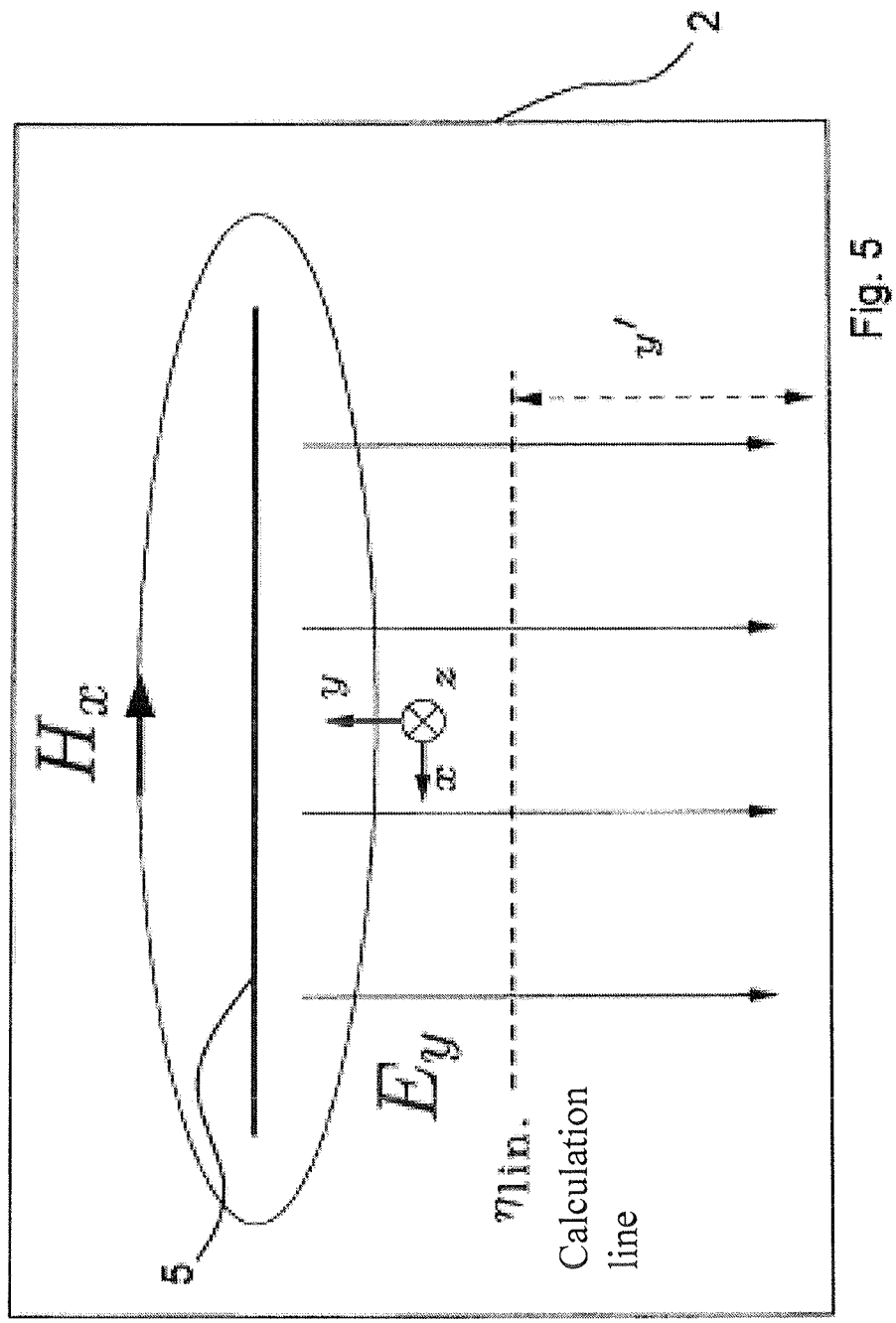
FIG. 5 shows the main field components of a TEM field within a GTEM cell in diagrammatic form.

FIG. 5 shows, in diagrammatic form, the theoretical curve of the main field components of a TEM field in relation to a Cartesian coordinate system. The coordinate system is defined in relation to the GTEM cell 1 in such a way that the x-axis runs transversely to the GTEM cell, the y-axis runs in a vertical direction and the z-axis in a longitudinal direction. In FIG. 5 it can be seen that the field line $H_x$ of the magnetic field runs around the septum 5 which in FIG. 5 is, like the z-axis, perpendicular to the plane of the paper. The field lines $E_y$ of the electric field run in a negative y-direction. The TEM field propagates in the direction of the z-axis.

Figure 6:
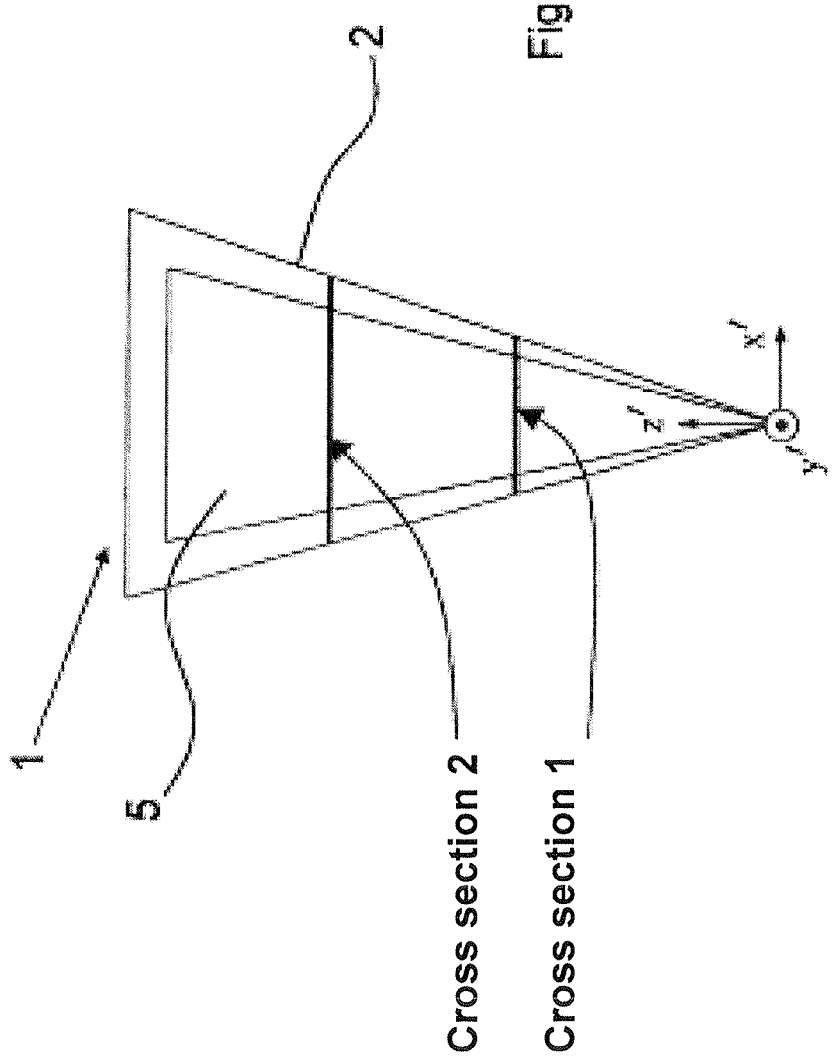
FIG. 6 shows a top view of a GTEM cell.

FIG. 6 shows the alignment of a ground-related coordinate system in a top view of the GTEM cell 1, including two cross-sections (cross-section 1 and 2) along which the intrinsic impedance is calculated.

Figure 7:
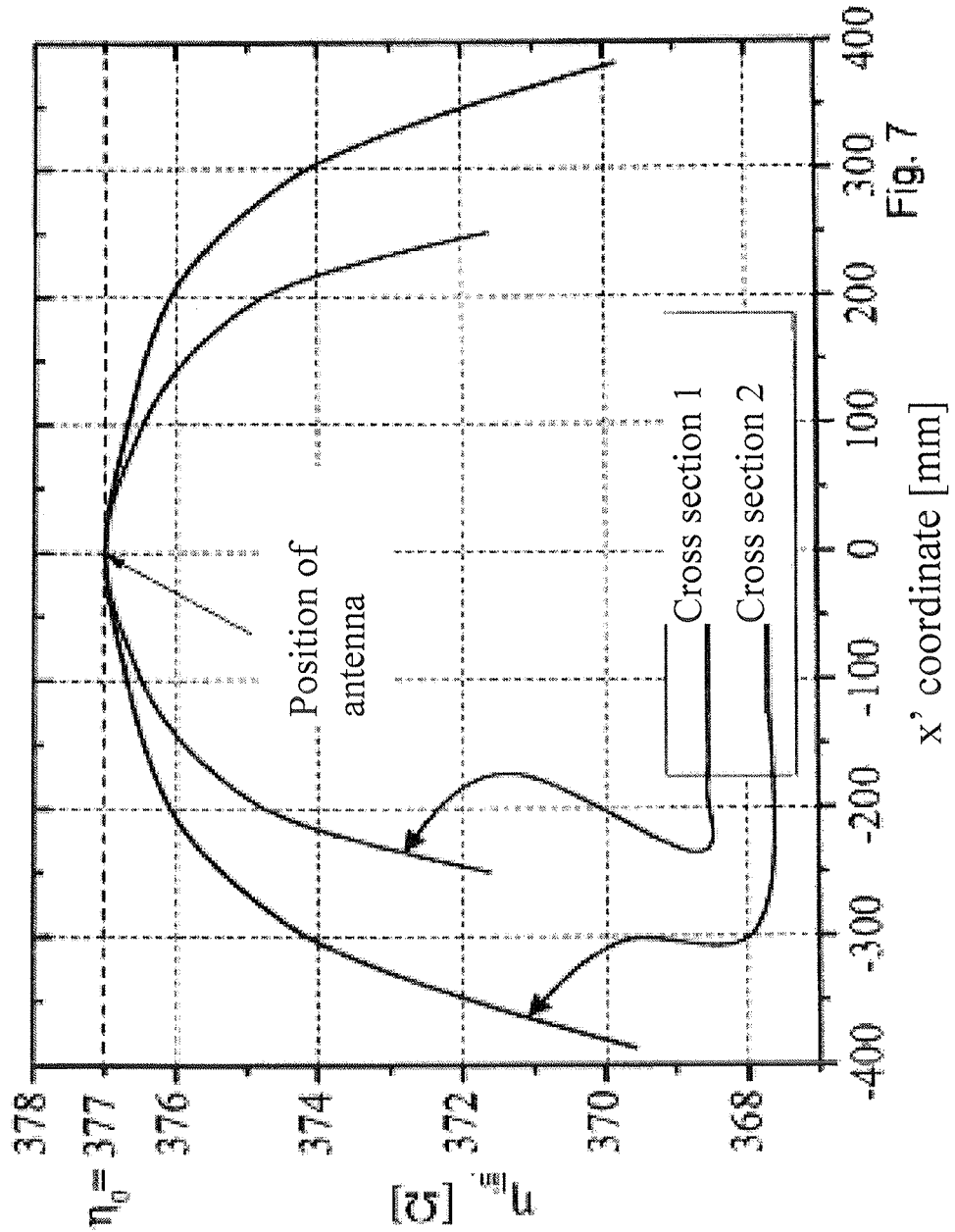
FIG. 7 shows the curve of the intrinsic impedances in a transverse direction of the GTEM cell, specifically as quotient of the main field components.

FIG. 7 shows the calculated intrinsic impedance $\eta_{lin}$ specifically as a quotient of the main field components for two cross-sections (cross-section 1 and 2) along the x'-coordinate which are chosen by way of example. As can be seen, with central positioning of the antenna which is to be examined in relation to the transverse direction of the GTEM cell (x'=0) an impedance of $\eta_0 = 377\ \Omega$ is achieved, which corresponds to the measuring conditions in free space, whereby, in addition, the TEM field is, advantageously, only present in this position as a Cartesian 2-component TEM field ($E_y$, $H_x$). At this point, the separate characterization of the antenna 8 in terms of its orthogonally polarized antenna properties is particularly simple, since by rotating the antenna by 90° the co-polar field components can be measured without containing distortions caused through the cross-polar field components.

Figure 8:
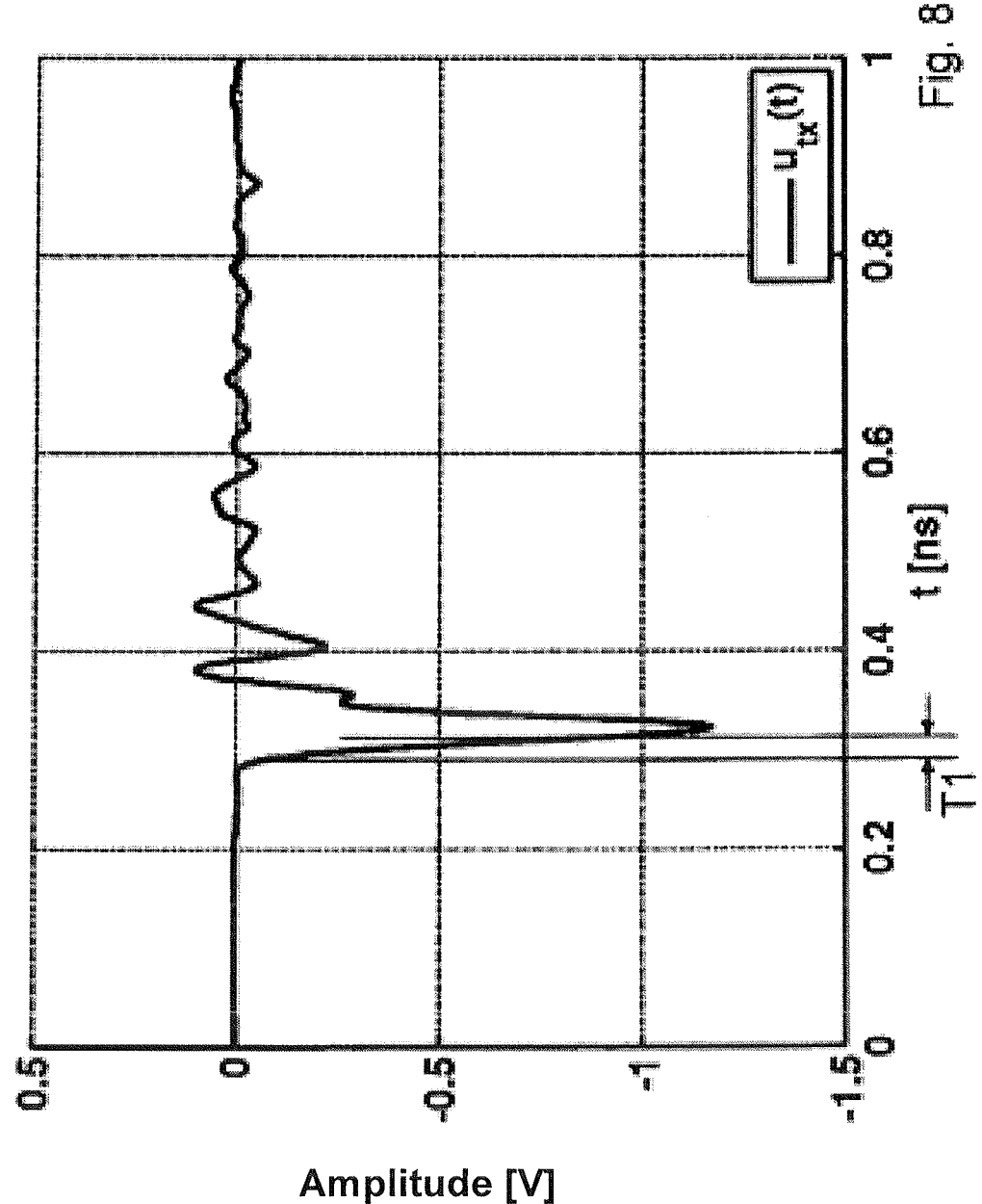
FIG. 8 shows an exemplary excitation pulse.

FIG. 8 shows an example of an excitation pulse $u_{tx}(t)$. As can be seen, the excitation pulse is relatively steep, in particular on its leading, falling signal edge. In the example shown, the time T1, in which the instantaneous value of the amplitude of the excitation pulse passes through the range between 10% and 90% of the maximal attained amplitude, is only around 20 ps. Accordingly, in the example shown this results in a signal edge steepness of 48 V/ns. This corresponds to a frequency bandwidth of around 20 GHz.

The response signal of the antenna is recorded as a voltage curve $u_{rx}(t)$. The reception pulse response $h^{AUT}_{rx}(t)$ (AUT means "Antenna Under Test") generally links the response signal of the antenna $u_{rx}(t)$, which exists as a voltage value, with the three electric field components ($E_x$, $E_y$, $E_z$) which strike the antenna in reception mode. The unit of such a pulse response is therefore usually stated in [m]. The response signal $u_{rx}(t)$ fundamentally contains a superimposition of the components of a pulse response vector oriented in the different coordinate directions of the coordinate system $h^{AUT}_{rx}(t) = (h_x(t), h_y(t), h_z(t))$. As a result of the propagation of the wave as a purely 2-component TEM field in Cartesian coordinates, as it exists, as described, along the center axis of the GTEM cell, the x- and z-components can be disregarded, so that the pulse response $h^{AUT}_{rx,y}(t)$ which needs to be determined in order to determine the antenna characteristic is derived, free of polarization, from the y-component, as follows:

$$h^{AUT}_{rx,TG,y}(t) = (u_{TG,rx}(t) *^{-1} u_{tx}(t)) \cdot \frac{1}{\alpha_{PL}}$$

where the operator $*^{-1}$ represents an inverse convolution operation. The value $\alpha_{PL}$ is a typical damping constant for the GTEM cell used. The index "TG" indicates that this involves a time portion of the response signal, namely the time segment of $u_{rx}(t)$ analyzed in order to determine the characteristic of the antenna, during which the response signal only contains propagating waves and no interfering influences caused through reflections and, moreover, the electromagnetic field at the location of the antenna is a TEM field.

Figure 9:
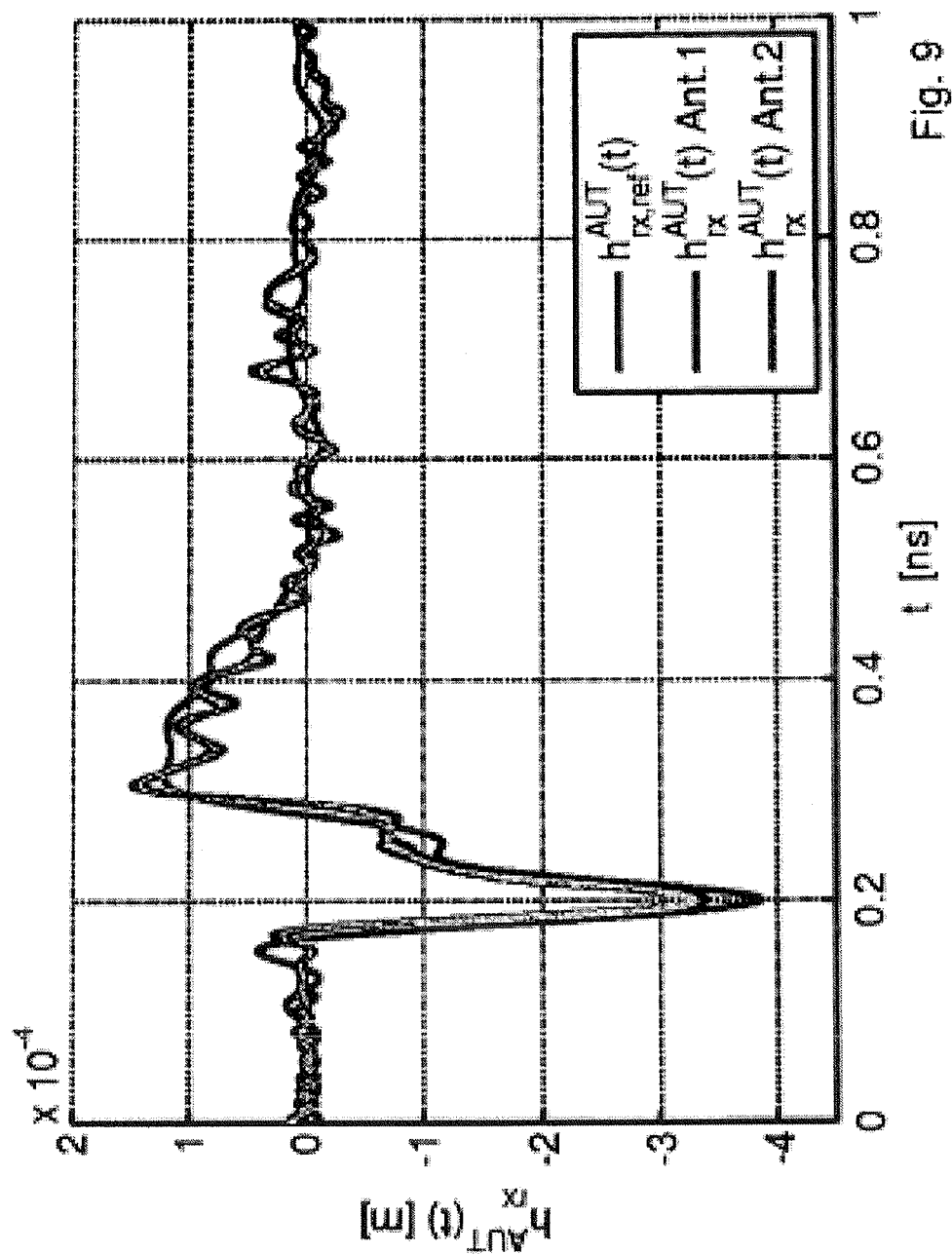
FIG. 9 shows exemplary pulse responses of the antenna.

FIG. 9 shows time curves for the pulse response $h^{AUT}_{rx}(t)$ of the antenna. Three curves are shown in the same diagram here. The curve $h^{AUT}_{rx,ref}(t)$ (with the least ripple) was determined in order to check the plausibility of the measuring results using the 2-antenna reference method. The two other curves (with the greater ripple) show the pulse responses of the two conical antennas 8 of identical construction which were examined and which were used for the 2-antenna reference method, as achieved through the invented method. As can be seen, the measured curves closely follow the curve of the reference measurement. If necessary, further characteristics of the antenna can be derived from the pulse response shown in FIG. 9. For this purpose, the time curve of the reception pulse response $h^{AUT}_{rx}(t)$ can, on the one hand, be transformed into the transmission pulse response $h^{AUT}_{tx}(t)$ or, on the other hand, either the reception pulse response or the transmission pulse response can be transformed into the frequency domain, for example through Fourier transformation, whereupon the corresponding frequency domain characteristics of the antenna such as gain, directional characteristic or efficiency can then be determined.

Figure 10:
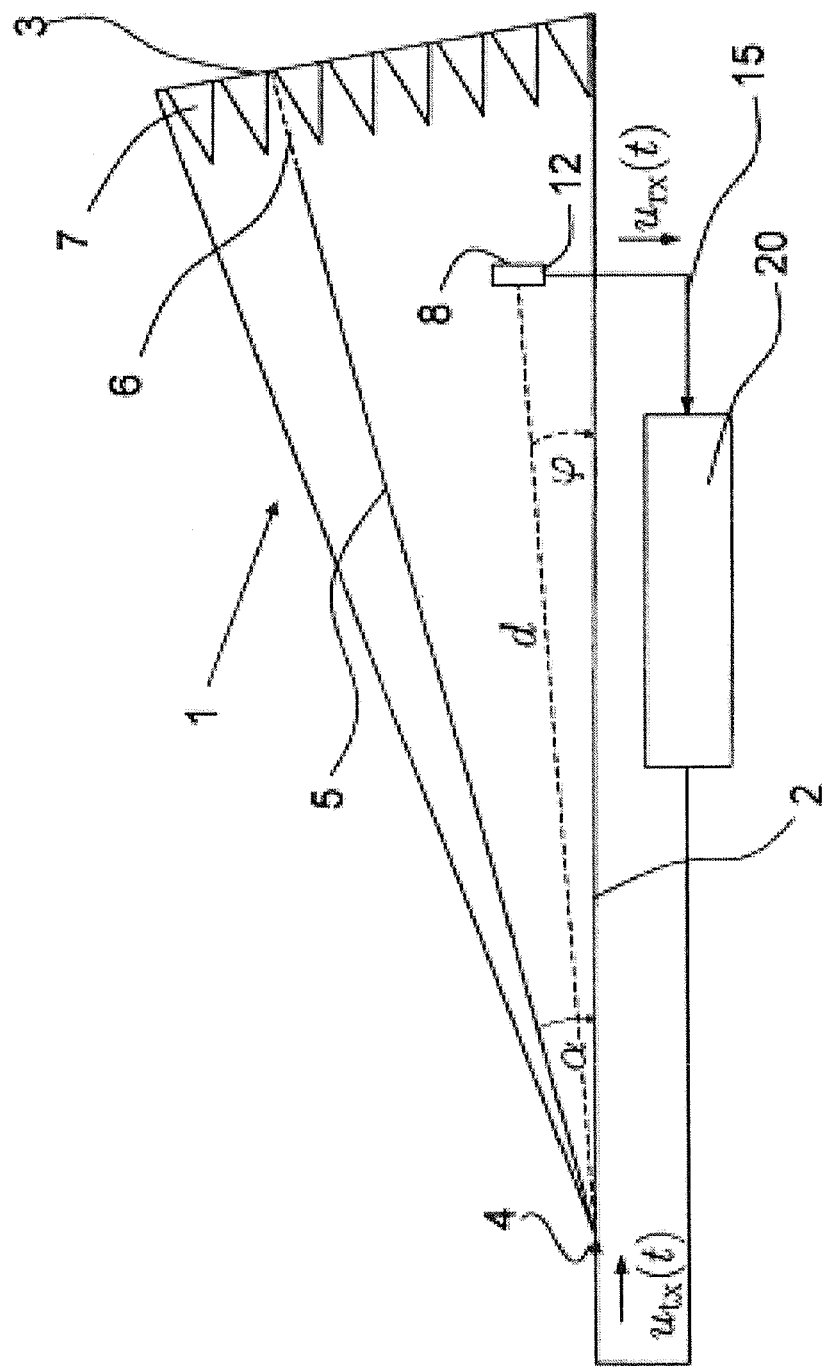
FIG. 10 shows a side view of a further embodiment of a measuring arrangement for performing the invented method with a GTEM cell.

FIG. 10 shows a similar measuring arrangement to that shown in FIG. 3. In contrast to FIG. 3, instead of the pulse generator 13 and the separate signal detection device 14, a combined device 20 in the form of a network analyzer is provided. The network analyzer 20 is particularly suitable for generating a typical frequency domain signal as excitation signal as well as for recording the reception values, i.e. of the response signal, in the frequency domain. The measuring arrangement according to FIG. 10 is fundamentally comparable with the measuring arrangement shown in FIG. 3, although the measuring arrangement according to FIG. 10 allows improved measurements in the frequency domain as a result of a higher dynamic range of the network analyzer 20 used as measuring device.

Both possibilities for recording signals, i.e., the measuring arrangement according to FIG. 3 and the measuring arrangement according to FIG. 10, are linked together via the Fourier transformation. The finite nature of the respective measuring ranges can lead to deviations in the transformation. It is therefore recommended that windowing be carried out in the respective range, i.e., that the measurements be carried out separately in different frequency ranges. Windows are to be preferred which display a low processing loss within the relevant range (also referred to in the technical literature as "processing gain" or "coherent gain"). The relevant range is identified in the frequency domain through the working range of the antenna, and in the time domain through the time interval T1 explained with reference to FIG. 8. Particularly suitable in terms of achieving a low processing loss are a rectangular window or the so-called "Tukey window", which is described in the publication by F. Harris, "On the use of windows for harmonic analysis with a discrete Fourier transform," Proceedings of the IEEE, Vol. 66, No. 1, pages 51 to 83, January 1978. Due to its parameterization, the Tukey window offers increased flexibility.

FIG. 11 shows an example of a measurement carried out using the invented method on a "standard gain horn". A N5230A network analyzer manufactured by Agilent was used to generate and record signals. A "standard gain horn" of the type SGA-50L manufactured by Seavey Engineering Associates, Inc., was used as antenna. The antenna was placed within a GTEM cell of the type GTEM 5305 manufactured by ENCO. The transition from the horn to the waveguide of the antenna takes place in the center of the GTEM cell at a distance of 1.51 m from the feed point 4 of the GTEM cell.

The continuous line in FIG. 11 shows the result of the measurement, wherein the effective gain in relation to a loss-free isotropic reference radiator in the unit dBi is shown over the frequency in GHz. The broken line shows the reference stated by the manufacturer of the antenna. As can be seen, there is a slight deviation between the measuring results and the reference specified by the manufacturer, whereby, however, the deviations lie within the range $<\pm 0.5$ dBi. These deviations can be attributed to the finite nature of the time interval T1. A closer convergence of the measuring results with the manufacturer's specifications can, for example, be achieved through determination of a smoothing function through the measuring results.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. Method for determining at least one characteristic of an antenna comprising the steps:

positioning an antenna of which said at least one characteristic is to be determined, in a space surrounded by a TEM waveguide; feeding an electric excitation signal ($u_{tx}(t)$) into a feed connection of the waveguide; receiving the electric response signal ($u_{rx}(t)$) emitted by the antenna as a result of the excitation signal ($u_{tx}(t)$);

determining said at least one characteristic of the antenna from at least one portion of the response signal ($u_{rx}(t)$) and a corresponding portion of the excitation signal ($u_{tx}(t)$), wherein said at least one characteristic ($h_{rx}(t)$) is proportional to a de-convolution of the response signal ($u_{rx}(t)$) determined with the excitation signal ($u_{tx}(t)$), and wherein the portion of the response signal ($u_{rx}(t)$) is a time segment evaluated in the time domain which satisfies the following conditions:

i) only one or several waves of the electromagnetic field caused by the excitation signal ($u_{tx}(t)$) and running from the feed connection towards the antenna exist at the location of the antenna; and ii) the electromagnetic field at the location of the antenna is a TEM field; wherein a characteristic data of the waveguide are determined through measurement and the characteristic is determined from the response signal ($u_{rx}(t)$), mathematically corrected by the characteristic data of the waveguide.

2. The method of claim 1 including a high frequency bandwidth excitation pulse used as the excitation signal ($u_{tx}(t)$).

3. The method of claim 2 wherein the response signal ($u_{rx}(t)$) is recorded in the time domain.

4. The method of claim 1 including a frequency domain signal used as the excitation signal ($u_{tx}(t)$).

5. The method of claim 4 including recording the response signal ($U_{rx}(t)$) in phase in the frequency domain.

6. The method of claim 1 including determining frequency domain characteristics of the antenna from the response signal ($u_{rx}(t)$).

7. The method of claim 1 including determining transmission properties of the antenna from the response signal ($u_{rx}(t)$).

8. The method of claim 1 including the frequency bandwidth of the excitation signal ($u_{tx}(t)$) being equal to or greater than the frequency bandwidth the antenna.

9. The method of claim 1 wherein the antenna includes an ultra-wideband antenna.

10. The method of claim 1 wherein the antenna is arranged in the waveguide, movable in at least one spatial dimension or at least one axis of rotation, and a first value of a characteristic of the antenna is determined in a first antenna position and at least a second value of the characteristic in a second antenna position.

11. The method of claim 1 wherein the dimensions of the waveguide, the positioning of the antenna in the waveguide in the longitudinal direction of the waveguide, or both, are chosen as a function of the duration of the response signal ($u_{rx}(t)$) necessary in order to determine the desired characteristic or the size of the antenna.

12. The method of claim 1 wherein the antenna is positioned in the waveguide such that the ratio between relatively orthogonal components of the electric field strength and the magnetic field strength of a Cartesian 2-component TEM field, wherein both components are orthogonal to the main direction of propagation of the electromagnetic field in the waveguide,is approximately the free space intrinsic impedance.

13. The method of claim 2 wherein said high frequency bandwidth excitation pulse comprises a Gaussian pulse shape.

14. The method of claim 2 including using a frequency domain signal as the excitation signal ($u_{tx}(t)$).

15. The method of claim 3 including using a frequency domain signal as the excitation signal ($u_{tx}(t)$).

16. The method of claim 13 including using a frequency domain signal as the excitation signal ($u_{tx}(t)$).

17. The method of claim 13 including recording the response signal ($u_{rx}(t)$) in phase in the frequency domain.

18. The method of claim 3 including determining frequency domain characteristics of the antenna from the response signal ($u_{rx}(t)$).

19. The method of claim 13 including determining frequency domain characteristics of the antenna from the response signal ($u_{rx}(t)$).

20. The method of claim 6 wherein said frequency domain characteristics of the antenna include gain, directional characteristic, efficiency, or any combination thereof.

21. The method of claim 19 wherein said frequency domain characteristics of the antenna include gain, directional characteristic, efficiency, or any combination thereof.

22. The method of claim 6 including the frequency bandwidth of the excitation signal ($u_{tx}(t)$) being equal to or greater than the frequency bandwidth the antenna.

23. The method of claim 19 including the frequency bandwidth of the excitation signal ($u_{tx}(t)$) being equal to or greater than the frequency bandwidth the antenna.

24. The method of claim 9 including said ultra-wideband antenna having at least 500 MHz frequency bandwidth.

25. The method of claim 1 wherein the waveguide comprises a TEM cell or a GTEM cell.

26. The method of claim 1 wherein a time curve of a reception pulse response $h^{AUT}_{rx}(t)$ is transformed into a transmission pulse response $h^{AUT}_{tx}(t)$ or, either the reception pulse response or the transmission pulse response is transformed into the frequency domain, whereupon corresponding frequency domain characteristics of the antenna including gain, directional characteristic or efficiency, is determined.

* * * * *